United States Patent
Ohmori et al.

(10) Patent No.: US 6,333,212 B1
(45) Date of Patent: Dec. 25, 2001

(54) SEMICONDUCTOR DEVICE AND MANUFACTURING METHOD THEREOF

(75) Inventors: Jun Ohmori; Hiroshi Iwasaki; Takuya Takahashi; Takanori Jin; Masatoshi Fukuda, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/707,850

(22) Filed: Nov. 8, 2000

Related U.S. Application Data

(62) Division of application No. 08/701,425, filed on Aug. 22, 1996, now Pat. No. 6,166,431.

(30) Foreign Application Priority Data

Aug. 25, 1995 (JP) .................................................. 7-217277

(51) Int. Cl.⁷ ...................................................... H01L 21/44
(52) U.S. Cl. .......................... 438/127; 438/112; 438/124; 438/126
(58) Field of Search .................................. 438/111, 112, 438/121, 122, 123, 124, 125, 126, 127

(56) References Cited

U.S. PATENT DOCUMENTS

| | | |
|---|---|---|
| 4,264,917 | 4/1981 | Ugon . |
| 4,483,067 | 11/1984 | Parmentier . |
| 4,703,420 | 10/1987 | Irwin . |
| 4,837,628 | 6/1989 | Sasaki . |
| 4,843,225 | 6/1989 | Hoppe . |
| 4,882,702 | 11/1989 | Struger et al. . |
| 4,916,662 | 4/1990 | Mizuta . |
| 4,943,464 | 7/1990 | Gloton et al. . |
| 4,980,856 | 12/1990 | Ueno . |
| 4,981,105 | 1/1991 | Petersen . |
| 4,994,895 | 2/1991 | Masuzaki et al. . |
| 5,018,017 | 5/1991 | Saski et al. . |
| 5,036,429 | 7/1991 | Kaneda et al. . |
| 5,091,618 | 2/1992 | Takahashi . |
| 5,153,818 | 10/1992 | Mukuogawa et al. . |
| 5,155,663 | 10/1992 | Harase . |
| 5,172,338 | 12/1992 | Mehrotra et al. . |

(List continued on next page.)

FOREIGN PATENT DOCUMENTS

| | | |
|---|---|---|
| 0 214 478 | 3/1987 | (EP) . |
| 0 228 278 | 7/1987 | (EP) . |
| 0 307 773 | 6/1989 | (EP) . |
| 0 321 326 | 6/1989 | (EP) . |
| 0 385 750 | 9/1990 | (EP) . |
| 0 406 610 | 1/1991 | (EP) . |
| 0 296 511 | 6/1991 | (EP) . |
| 0 476 892 | 3/1992 | (EP) . |
| 0 599 194 | 8/1996 | (EP) . |

(List continued on next page.)

OTHER PUBLICATIONS

E. Harari, Nikkei Electronics (Feb. 17, 1992), pp. 155–168.

Primary Examiner—Kevin M. Picardat
(74) Attorney, Agent, or Firm—Finnegan, Henderson, Farabow, Garrett & Dunner, L.L.P.

(57) ABSTRACT

A semiconductor device with a thickness of 1 mm or less is disclosed, that comprises a frame plate main body with a thickness in the range from 0.1 mm to 0.25 mm, a semiconductor pellet disposed on a first surface of the frame plate main body and with a thickness in the range from 0.2 mm to 0.3 mm, an external connection lead, one end thereof being connected to a peripheral portion of the first surface of the frame plate main body, the other end thereof extending to the outside of the frame plate main body, a bonding wire for electrically connecting an electrode of the semiconductor pellet and a connection portion of the end of the external connection lead, and a sealing resin layer for covering and sealing at least a region including the semiconductor pellet, the bonding wire, and a connection portion.

5 Claims, 2 Drawing Sheets

U.S. PATENT DOCUMENTS

| | | |
|---|---|---|
| 5,285,352 | 2/1994 | Pastore et al. . |
| 5,293,236 | 3/1994 | Adachi et al. . |
| 5,297,029 | 3/1994 | Nakai et al. . |
| 5,297,148 | 3/1994 | Harari et al. . |
| 5,299,089 | 3/1994 | Lwee . |
| 5,327,010 | 7/1994 | Uenaka et al. . |
| 5,343,076 | 8/1994 | Katayama et al. . |
| 5,343,319 | 8/1994 | Moore . |
| 5,375,037 | 12/1994 | Le Roux . |
| 5,388,084 | 2/1995 | Itoh et al. . |
| 5,430,859 | 7/1995 | Norman et al. . |
| 5,438,359 | 8/1995 | Aoki . |
| 5,457,590 | 10/1995 | Barret et al. . |
| 5,469,399 | 11/1995 | Sato et al. . |
| 5,475,441 | 12/1995 | Parulski et al. . |
| 5,488,433 | 1/1996 | Washino et al. . |
| 5,493,151 | 2/1996 | Asada et al. . |
| 5,508,971 | 4/1996 | Cernea et al. . |
| 5,509,018 | 4/1996 | Niijima et al. . |
| 5,535,328 | 7/1996 | Harari et al. . |
| 5,550,709 | 8/1996 | Iwasaki . |
| 5,552,632 | 9/1996 | Iwasaki . |
| 5,563,825 | 10/1996 | Cernea et al. . |
| 5,566,105 | 10/1996 | Tanaka et al. . |
| 5,568,424 | 10/1996 | Cernea et al. . |
| 5,572,466 | 11/1996 | Sukegawa . |
| 5,572,478 | 11/1996 | Sato et al. . |
| 5,574,309 | 11/1996 | Papapietro et al. . |
| 5,584,043 | 12/1996 | Burkart . |
| 5,592,420 | 1/1997 | Cernea et al. . |
| 5,596,532 | 1/1997 | Cernea et al. . |
| 5,602,987 | 2/1997 | Harari et al. . |
| 5,608,673 | 3/1997 | Rhee . |
| 5,611,057 | 3/1997 | Pecone et al. . |
| 5,615,344 | 3/1997 | Corder . |
| 5,621,685 | 4/1997 | Cernea et al. . |
| 5,638,321 | 6/1997 | Lee et al. . |
| 5,652,185 * | 7/1997 | Lee .................................. 438/124 |
| 5,654,243 * | 8/1997 | Yoneda et al. ................... 438/126 |
| 5,663,901 | 9/1997 | Wallace et al. . |
| 5,671,229 | 9/1997 | Harari et al. . |
| 5,693,570 | 12/1997 | Cernea et al. . |
| 5,728,606 * | 3/1998 | Laine et al. ..................... 438/122 |
| 5,733,802 * | 3/1998 | Inoue et al. ..................... 438/127 |
| 5,783,466 * | 7/1998 | Takahashi et al. ............... 438/122 |
| 5,887,145 | 3/1999 | Harari et al. . |
| 6,002,605 | 12/1999 | Iwasaki et al. . |
| 6,054,774 | 4/2000 | Ohmori et al. . |

FOREIGN PATENT DOCUMENTS

| | | |
|---|---|---|
| 2 439 438 | 11/1980 | (FR) . |
| 2 684 236 | 5/1993 | (FR) . |
| 57-10251 | 1/1982 | (JP) . |
| A 58-092597 | 6/1983 | (JP) . |
| 62-2706 | 1/1987 | (JP) . |
| A 1-209194 | 8/1989 | (JP) . |
| A 1-210394 | 8/1989 | (JP) . |
| 2-160592 | 6/1990 | (JP) . |
| 2-301155 | 12/1990 | (JP) . |
| 3-14192 | 1/1991 | (JP) . |
| 3-2099 | 1/1991 | (JP) . |
| A 3-001560 | 1/1991 | (JP) . |
| 3-114788 | 5/1991 | (JP) . |
| 4-16396 | 1/1992 | (JP) . |
| 4-148999 | 5/1992 | (JP) . |
| A 4-241444 | 8/1992 | (JP) . |
| 5-17269 | 1/1993 | (JP) . |
| 5-134820 | 6/1993 | (JP) . |
| 6-195524 | 7/1994 | (JP) . |
| 6-236316 | 8/1994 | (JP) . |
| A 6-295974 | 10/1994 | (JP) . |
| 6-318390 | 11/1994 | (JP) . |
| A 6-334106 | 12/1994 | (JP) . |
| A 7-029927 | 1/1995 | (JP) . |
| A 7-058246 | 3/1995 | (JP) . |
| 936796 | 10/1995 | (JP) . |

* cited by examiner

SEMICONDUCTOR DEVICE AND MANUFACTURING METHOD THEREOF

This is a division of parent application Ser. No. 08/701,425, filed Aug. 22, 1996 now U.S. Pat. No. 6,166,481. The contents of this parent application being relied upon and incorporated by reference herein.

BACKGROUND OF THE INVENTION

1. Field of the Invention

The present invention relates to a semiconductor device and a manufacturing method thereof, particularly, to a thin type semiconductor device having a large semiconductor pellet sealed with a resin and a manufacturing method thereof.

2. Description of the Related Art

In recent years, as the size of electronic devices are being drastically reduced, semiconductor devices, which are major electronic parts of the electronic devices, are being required to have large capacity and thin structure.

To allow a semiconductor device to have the large capacity, the size of a semiconductor pellet for use with the semiconductor device is being increased. In other words, the storage capacity of conventional semiconductor pellets for use with IC cards was around 4 kbytes. Recently, semiconductor pellets with the storage capacity of 1 Mbytes or more are being used. In this situation, the plane area of the semiconductor pellets exceeds 40 $mm^2$. Thus, the area of a semiconductor pellet against the size of an IC card increases.

On the other hand, as thinning means for semiconductor devices, a structure where a semiconductor pellet is mounted on a so-called frame plate and they are sealed with a resin is popular from a view point of manufacturing cost. The frame plate is a thin insulation plate such as a conventional lead frame of which a plurality of semiconductor pellets are mounted on one main surface and a flat connection terminal block electrically connected to the semiconductor pellets is disposed on the other main surface.

However, when semiconductor pellets whose plane area exceeds for example 40 $mm^2$ are mounted on a frame or the like and the semiconductor pellets are sealed with a resin by the transfer mold method, if the sealing thickness is reduced, the flowing characteristic of the sealing resin is remarkably deteriorated. Thus, it was very difficult to reduce the thickness of the semiconductor devices to 1 mm or less.

In other words, to reduce the thickness of a semiconductor device, a frame plate, a semiconductor pellet, and a sealing resin are thinned.

FIG. 3 is a sectional view showing a thin type semiconductor device. Reference numeral 1 is a frame plate with a thickness of around 0.25 mm. Reference numeral 2 is an adhesive layer disposed on one main surface of the frame 1. The thickness of the adhesive layer 2 is around 0.02 mm. Reference numeral 3 is a semiconductor pellet secured on the surface of the frame plate 1 with the adhesive layer 2. The thickness and plane area of the semiconductor pellet 3 are around 0.25 mm and 40 $mm^2$, respectively. Reference numeral 4 is a wiring pattern disposed on the main surface of the frame plate 1. The wiring pattern 4 includes a connection pad. Reference numeral 5 is a bonding wire that electrically connects an electrode of the semiconductor pellet 3 and a connection pad of the wiring pattern 4. Reference numeral 6 is a flat type external connection terminal block disposed on the other main surface of the frame plate 1. Reference numeral 7 is a transfer mold type sealing resin that entirely covers and seals the semiconductor pellet 3, the bonding wire 5, the connection pad of the wiring pattern 4, and so forth. The height of the bonding wire 5 measured from the surface of the semiconductor pellet 3 is 0.15 mm or less. The height (thickness) of the sealing resin layer 7 is larger than the height of the bonding wire 5 by 0.03 mm or less.

Thus, theoretically, a semiconductor device with a thickness of 0.7 mm is structured. The thickness of the peripheral portion (thick portion) of the sealing resin 7 is around 0.45 mm. On the other hand, due to the deviation of the flow of the resin in the resin sealing process, a cavity portion takes place at the center portion (thin portion) of the sealing resin layer 7.

FIGS. 4 and 5 are plan views showing flows of a sealing resin in the case that a semiconductor pellet 3 with a plane area of 40 $mm^2$ or more is mounted on a frame plate and sealed with a resin by the transfer mold method.

In a die 8, a pressure-fitted sealing resin (for example, bisphenol type epoxy resin compound containing inorganic powder as a filler) is melted and fluidized. As denoted by solid line arrows shown in FIGS. 4 and 5, the compound flows in the peripheral portion of the semiconductor pellet 3 with a relatively large space. Thus, this region is filled and coated with the compound.

On the other hand, since the space between the upper surface of the semiconductor pellet 3 and the die 8 is narrow the sealing resin does not properly flow (as denoted by dotted line arrows) and can not densely fill the space with the sealing resin. In particular, as semiconductor pellets are becoming large, this tendency is becoming strong. Thus, it is difficult to densely fill the space between the semiconductor pellet and the die with a sealing resin.

Consequently, when a sealed semiconductor device is mounted by an automatic mounting machine or the like, the semiconductor device tends to be broken.

SUMMARY OF THE INVENTION

The present invention is made from the above-described point of view. An object of the present invention is to provide a semiconductor device that has a large and high-reliability semiconductor pellet and that can be mounted by an automatic mounting machine and a manufacturing method thereof.

A first aspect of the present invention is a semiconductor device with a thickness of 1 mm or less, comprising a frame plate main body with a thickness in the range from 0.1 mm to 0.25 mm, a semiconductor pellet disposed on a first surface of the frame plate main body and with a thickness in the range from 0.2 mm to 0.3 mm, an external connection lead, one end thereof being connected to a peripheral portion of the first surface of the frame plate main body, the other end thereof extending to the outside of the frame plate main body, a bonding wire for electrically connecting an electrode of the semiconductor pellet and a connection portion of the end of the external connection lead, and a sealing resin layer for covering and sealing at least the semiconductor pellet, the bonding wire, and a region including a connection portion.

The first aspect of the present invention is the semiconductor device, wherein the difference between the upper surface of the external connection lead and the upper surface of the semiconductor pellet and/or the difference between the lower surface of the external connection lead and the lower surface of the frame plate with the semiconductor pellet is 0.2 mm or less.

The first aspect of the present invention is the semiconductor device, wherein the plane area of the semiconductor pellet is at least 40 mm².

The frame plate main body of the present invention may be formed in a doughnut shape of which the center portion is removed (only the peripheral portion is present).

A second aspect of the present invention is a semiconductor device with a thickness of 1 mm or less, comprising a frame plate main body having a recess portion on a first main surface, the depth of the recess portion being in the range from 0.2 mm to 0.3 mm, the thickness of the frame plate main body being in the range from 0.3 mm to 0.5 mm, a semiconductor pellet disposed in the recess portion, the thickness of the semiconductor pellet being in the range from 0.2 mm to 0.3 mm, a wiring pattern disposed on the periphery of the first main surface of the frame plate main body, the wiring pattern having a connection pad, a bonding wire for electrically connecting an electrode of the semiconductor pellet and a corresponding connection pad, a flat type external connection terminal disposed on a second main surface of the frame plate main body and connected to the wiring pattern via a through-hole, and a sealing resin layer for sealing at least the semiconductor pellet, the bonding wire, and a region including the connection pad.

The second aspect of the present invention is the semiconductor device, wherein the difference between the upper surface of the frame plate and the upper surface of the semiconductor pellet is 0.2 mm or less.

The second aspect of the present invention is the semiconductor device, wherein the plane area of the semiconductor pellet is at least 40 mm².

A third aspect of the present invention is a manufacturing method of a semiconductor device with a thickness of 1 mm or less, comprising the steps of (a) connecting a peripheral portion of a first surface of a frame plate main body with a thickness in the range from 0.1 mm to 0.25 mm and an external connection lead in such a manner that the external connection lead extends to the outside of the frame plate main body, (b) mounting a semiconductor pellet with a thickness in the range from 0.2 mm to 0.3 mm to the first surface of the frame plate main body, (c) electrically connecting an electrode of the semiconductor pellet and a connection portion at the end of the corresponding external connection lead with a bonding wire, and (d) mounting the resultant module of the step (c) to a transfer mold type die and pressure-fitting a sealing resin so as to transfer-mold and resin-seal at least the semiconductor pellet, the bonding wire, and a region including a connection portion.

The third aspect of the present invention is the manufacturing method further comprising the step of mounting the semiconductor pellet in such a manner that the difference between the upper surface of the external connection lead and the upper surface of the semiconductor pellet and/or the difference between the lower surface of the external connection lead and the lower surface of the frame plate is 0.2 mm or less.

A fourth aspect of the present invention is a manufacturing method of a semiconductor device with a thickness of 1 mm or less, comprising the steps of (a) forming a recess portion on a first main surface of a frame plate main body and a wiring pattern including a connection pad to a peripheral portion of the first main surface, the thickness of the frame plate main body being in the range from 0.3 mm to 0.5 mm, the depth of the recess portion being in the range from 0.2 mm to 0.3 mm, the recess portion being adapted for mounting the semiconductor pellet, (b) electrically connecting an electrode of the semiconductor pellet and a corresponding connection pad with a bonding wire, (c) forming a flat type external connection terminal on a second main surface of the frame plate main body, the external connection terminal being connected to the wiring pattern on the first main surface via a through-hole, and (d) mounting the resultant module of the step (c) to a transfer mold type die and pressure-fitting a sealing resin so as to transfer-mold and resin-seal at least the semiconductor pellet, the bonding wire, and a region including a connection portion.

The fourth aspect of the present invention is the manufacturing method, wherein the difference between the upper surface of the frame plate and the upper surface of the semiconductor pellet is 0.2 mm or less.

The fourth aspect of the present invention is the manufacturing method, wherein the plane area of the semiconductor pellet is at least 40 mm².

In the semiconductor device according to the first aspect, the thickness of the frame plate main body is in the range from 0.1 to 0.25 mm. This is because when the thickness is 0.1 mm or less, the substantial strength is insufficient. When the thickness exceeds 0.25 mm, it adversely affects the thin structure of the semiconductor device. The thickness of the frame plate main body is preferably in the range from 0.1 to 0.15 mm.

When a semiconductor pellet with a storage capacity of 1 Mbytes or more is used, the thickness thereof is in the range from 0.2 mm to 0.3 mm. The plane area of the semiconductor pellet is at least 40 mm² and preferably around 60 mm².

The external connection terminal lead is composed of such as #42 alloy, which is used for a lead frame or the like. The thickness of the lead is in the range from 0.1 to 0.3 mm.

The bonding wire is composed of Au or Al. In the semiconductor device according to the present invention, the bonding height measured from the upper surface of the semiconductor pellet is in the range from 0.1 mm to 0.2 mm. When the bonding height exceeds such a range, it adversely affects the thin structure of the semiconductor device.

In the semiconductor device according to the second aspect of the present invention, the thickness of the peripheral portion of the frame plate main body is in the range from 0.3 mm to 0.5 mm. The depth of the recess portion is in the range from 0.2 mm to 0.3 mm. The thickness of the frame at the recess portion is in the range from 0.1 mm to 0.25 mm. These ranges are essential to accomplish a semiconductor device with a thickness of 1 mm or less according to the present invention. When the thickness of the frame at the recess portion is less than 0.1 mm, the strength of the resultant semiconductor device is insufficient. In contrast, when the thickness exceeds 0.25 mm, it adversely affects the thin structure of the semiconductor device.

The frame plate main body is composed of ceramics, synthesized resin, or the like. The recess portion of the frame plate main body may be formed by machining a plate material with a thickness in the range from 0.3 mm to 0.5 mm. Alternatively, a frame material with a hollow portion (in a doughnut shape) and with a thickness in the range from 0.2 mm to 0.3 mm may be adhered 15 to a plate material with a thickness in the range from 0.1 mm to 0.25 mm. As a further alternative method, a frame plate main body composed of ceramics or synthesized resin with the recess portion may be molded.

When a semiconductor pellet with a storage capacity of 1 Mbytes or more is used, the thickness thereof is in the range from 0.2 mm to 0.3 mm. The plane area of the semiconductor pellet is at least 40 mm² and preferably around 60 mm².

The external connection terminal lead is composed of such as #42 alloy, which is used for a lead frame or the like. The thickness of the lead is in the range from 0.1 to 0.3 mm.

The bonding wire is composed of Au or Al. In the semiconductor device according to the present invention, the bonding height measured from the upper surface of the semiconductor pellet is in the range from 0.1 mm to 0.2 mm. When the bonding height exceeds such a range, it adversely affects the thin structure of the semiconductor device.

The sealing resin layer is preferably disposed on a single surface on which a semiconductor pellet is mounted so as to accomplish the thin structure of the resultant semiconductor device. However, depending on the structure of a frame plate for use, sealing resin layers may be disposed on both surfaces of the semiconductor pellets. In each case, the sealing resin layer(s) should satisfactorily seal the bonding wire so that the semiconductor device is not warped.

In the manufacturing method of the semiconductor device according to the third aspect of the present invention, when the module wherein the semiconductor pellet has been mounted and wire-bonded is placed in the transfer mold type die, the difference between the upper surface of the external connection lead and the upper surface of the semiconductor pellet and/or the difference between the lower surface of the external connection lead and the lower surface of the frame plate should be 0.2 mm or less. In other words, in the above-described structure, when a molten epoxy resin compound is transfer-molded, the flowing characteristic of the pressure-fitted sealing resin is well-balanced. Thus, the semiconductor device with the sealing resin layer free from a cavity portion can be easily manufactured.

In the manufacturing method of the semiconductor device according to the fourth aspect of the present invention, the semiconductor pellet is mounted in such a manner that the difference between the upper surface of the frame plate and the upper surface of the semiconductor pellet is 0.2 mm or less. Thus, when a molten epoxy resin compound is transfer-molded, the flow of the pressure-fitted sealing resin is well-balanced in the die. The space between the semiconductor pellet and the die is properly filled with the compound. Thus, the semiconductor device with a sealing resin layer free from a cavity can be easily manufactured.

These and other objects, features and advantages of the present invention will become more apparent in light of the following detailed description of best mode embodiments thereof, as illustrated in the accompanying drawings.

DESCRIPTION OF THE PREFERRED EMBODIMENTS

Next, with reference to FIGS. 1 and 2, embodiments of the present invention will be described.

Figure 1:
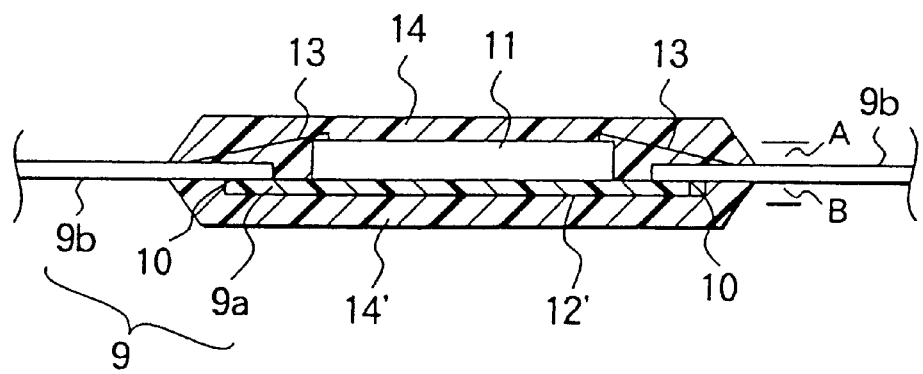
FIG. 1 is a sectional view showing a structure of principal portions of a semiconductor device according to a first aspect of the present invention.

FIG. 1 shows an outline of a structure of a semiconductor device according to a first embodiment of the present invention. In FIG. 1, reference numeral 9a is a frame plate main body composed of a resin plate. The width, length, and thickness of the frame plate main body 9a are for example 6 mm, 12 mm, and 0.15 mm, respectively. Reference numeral 9b is a conductive lead (external connection terminal) integrally connected to the peripheral portion of the frame plate main body 9a through a polyimide resin type adhesive layer 10 with a thickness in the range from 0.02 to 0.05 mm. The thickness of the conductive lead 9b is around 0.2 mm. The frame plate main body 9a and the conductive lead 9b compose a frame plate 9.

Reference numeral 11 is a semiconductor pellet (IC pellet) that is adhered and secured with a polyimide resin type adhesive layer 12 (with a thickness in the range from 0.02 to 0.05 mm) on the frame plate main body 9a. The thickness and plane area of the semiconductor pellet 11 are around 0.25 mm and 60 mm$^2$, respectively. Reference numeral 13 is a bonding wire that electrically connects an electrode of the semiconductor pellet 11 to a corresponding lead 9b. The material of the bonding wire is Au, Al, or the like.

Reference numerals 14 and 14' are sealing resin layers that cover and seal the frame plate main body 9a, the semiconductor pellet 11, and part of the lead 9b including the bonding wire 13.

In the above-described structure, the height of the bonding wire 13 measured from the surface of the semiconductor pellet 11 is in the range from 0.1 to 0.2 mm. Thus, the thickness of the semiconductor device according to the first embodiment of the present invention is as thin as 0.5 to 1.0 mm. In addition, the semiconductor device has a high flatness free from warp.

Next, the manufacturing method of the semiconductor device according to the first embodiment of the present invention will be described.

The lead 9b with a thickness of around 0.2 mm was connected to the frame plate main body 9a composed of an insulation resin with a thickness of around 0.15 mm. Thus, the frame plate 9 was obtained.

Thereafter, the semiconductor pellet (IC pellet) 11 with a thickness of around 0.25 mm and a plane area of 60 mm$^2$ or more was adhered to the frame plate main body 9a through the polyimide resin type adhesive layer 12'.

Thereafter, an electrode of the semiconductor pellet 11 was electrically connected to a corresponding lead 9b with the bonding wire 13. The semiconductor device main body portion was assembled in such a manner that the difference (A) between the upper surface of the lead 9b and the upper surface of the semiconductor pellet 11 was 0.2 mm or less and the difference (B) between the lower surface of the lead 9b and the lower surface of the frame plate main body 9a were 0.2 mm or less (see FIG. 1).

The semiconductor device main body portion in the above-described structure was mounted in a prepared transfer mold type die and transfer-molded with bisphenol type epoxy resin as a sealing resin, which is conventionally used for sealing a semiconductor device. Thus, the semiconductor device as shown in FIG. 1 was manufactured. In the transfer mold process, the sealing resin was heated and melted at a temperature of around 180° C. In addition, the sealing resin was pressure-fitted at a pressure of around 10 MPa.

In the semiconductor device with the above-described structure, the difference between the thickness at the center portion (semiconductor pellet portion) of the sealing resin layers 14 and 14' and the thickness at the peripheral portion thereof is as small as around 0.2 mm. No cavity takes place in the center portion. The strength of the sealing resin is remarkably improved. Thus, when the semiconductor device is mounted on a wiring board by an automatic mounting machine, the semiconductor device can be prevented from being damaged.

In addition, as described above, since the sealing resin layers are dense and have a high electric protecting characteristic, the semiconductor device according to the first embodiment of the present invention functions as a high reliability semiconductor device. In the structure, both surfaces of the semiconductor device were covered and sealed with the sealing resin layers 14 and 14'. However, the sealing resin layer 14' can be omitted.

Second Embodiment

Figure 2:
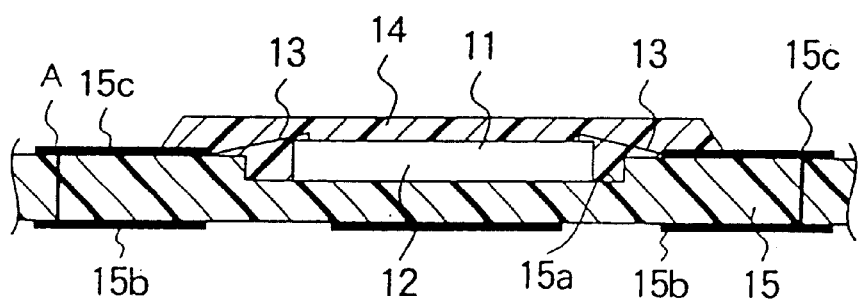
FIG. 2 is a sectional view showing a structure of principal portions of a semiconductor device according to a second aspect of the present invention.
Figure 3:
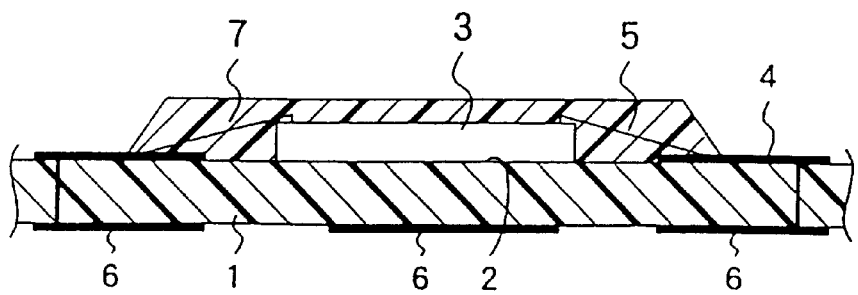
FIG. 3 is a sectional view showing a structure of principal portions of a conventional semiconductor device.
Figure 4:
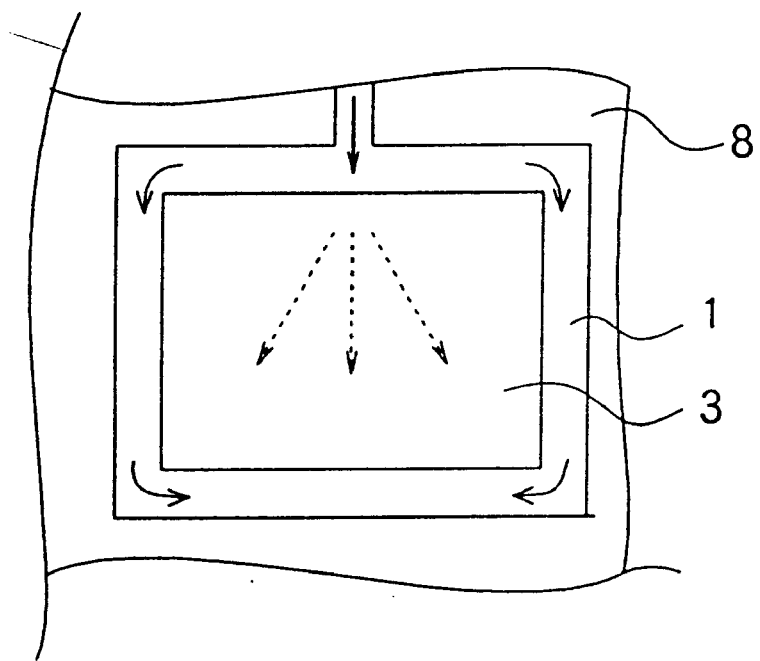
FIG. 4 is a plan view showing a flow of a mold resin in a die in a transfer mold process.
Figure 5:
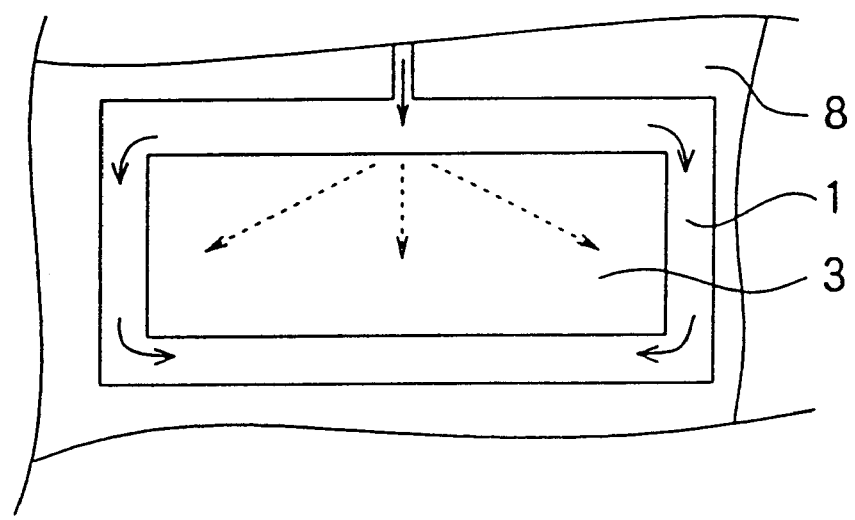
FIG. 5 is another plan view showing a flow of a mold resin in a die in the transfer mold process.

FIG. 2 shows an outline of a structure of a semiconductor device according to a second embodiment of the present invention.

In FIG. 2, reference numeral 15 is a wiring type frame having a recess portion in which a semiconductor pellet 11 is mounted. The depth of the recess portion is around 0.25 mm.

The thickness of the recess portion is around 0.15 mm. The thickness of the peripheral portion is 0.4 mm. The wiring type frame 15 is composed of for example synthesized resin or ceramics. The semiconductor pellet 11 is mounted in the recess portion. The peripheral portion is flat and has a wiring pattern 15c including a connection pad. The rear surface of the wiring type frame 15 is flat and has a flat type external connection terminal 15b that electrically connects the bonding portion via a through-hole.

The semiconductor pellet 11 is adhered and secured to the recess portion of the frame plate 15 via a polyimide resin type adhesive layer 12 with a thickness in the range from 0.02 to 0.05 mm. The semiconductor pellet 11 is an IC pellet with a thickness of around 0.25 mm and a plane area of 60 mm$^2$.

An electrode of the semiconductor pellet 11 is electrically connected to the wiring pattern 15c including a corresponding connection pad with the bonding wire 13. The bonding wire 13 is composed of Au or Al. The frame plate 15, the semiconductor pellet 11, and part of the wiring pattern including the bonding wire 13 are covered and sealed with the sealing resin layer 14 composed of epoxy resin or the like.

In the above-described structure, the height of the bonding wire 13 measured from the surface of the semiconductor pellet 11 is in the range from 0.1 to 0.2 mm. The thickness of the semiconductor device according to the second embodiment of the present invention is as thin as 0.5 to 1.0 mm. The semiconductor device has a high flat characteristic free from warp.

In the first embodiment, the region 9a in which the semiconductor pellet 11 is mounted and the external connection lead 9b are separately structured. However, in the second embodiment, the region 9a and the lead 9b are integrally structured.

Next, the manufacturing method of the semiconductor device according to the second embodiment will be described.

The semiconductor pellet (IC pellet) 11 with a thickness of around 0.25 mm and a plane area of 60 mm$^2$ was adhered and secured to a particular region 15a of the recess portion of the frame plate 15 (the depth of the recess portion being in the range from 0.2 to 0.3 mm) via the polyimide resin adhesive layer 12.

Thereafter, the electrode of the semiconductor pellet 11 was electrically connected to the corresponding connection pad of the wiring pattern 15 with the bonding wire 13. The semiconductor device main body portion was assembled in such a manner that the difference between the upper surface of the peripheral portion of the recess portion of the frame plate 15 (precisely speaking, the upper surface of the wiring pattern 15c) and the upper surface of the semiconductor pellet 11 was 0.2 mm or less.

The semiconductor device main body portion in the above-described structure was mounted in a prepared transfer mold type die and transfer-molded with bisphenol type epoxy resin as a sealing resin, which is conventionally used for sealing a semiconductor device. Thus, the semiconductor device as shown in FIG. 2 was manufactured. In the transfer mold process, the sealing resin was heated and melted at a temperature of around 180° C. In addition, the sealing resin was pressure-fitted at a pressure of around 10 MPa.

In the semiconductor device with the above-described structure, the difference between the thickness at the center portion (semiconductor pellet portion) of the sealing resin layer 14 and the thickness at the peripheral portion thereof is as small as around 0.2 mm. No cavity takes place in the center portion. The strength of the sealing resin is remarkably improved. Thus, when the semiconductor device is mounted on a wiring board by for example an automatic mounting machine, the semiconductor device can be prevented from being damaged. In addition, as described above, since the sealing resin layers are dense and have a high electric protecting characteristic, the semiconductor device according to the first embodiment of the present invention functions as a high reliability semiconductor device.

It should be noted that the present invention is not limited to the above-described structures. For example, the size and thickness of the semiconductor pellet can be freely selected as long as the size of the semiconductor pellet is 40 cm$^2$ or more and the thickness of the semiconductor device is 1 mm or less. In addition, the structure and material of the frame plate and/or the material of the sealing resin layer are not limited to those described above.

As is clear from the above-description, according to the first and second embodiments of the present invention, since a large semiconductor pellet with a high integration and a sealing resin layer that is dense (free of a cavity portion) and that has a nearly equal sealing thickness are disposed, the sealing resin layer can be prevented from being damaged by an external force or the like. Thus, the yield and reliability of the semiconductor device can be improved. In addition, the semiconductor device can be mounted by the automatic mounting machine. Thus, the semiconductor device according to the present invention can remarkably contribute to the productivity of a semiconductor mounting circuit device.

Moreover, according to the manufacturing methods of the semiconductor devices according to the first and second embodiments of the present invention, the semiconductor devices can be provided with high yield.

From view points of the producing and manufacturing process, since the semiconductor pellet is mounted in the recess portion, the thickness of the semiconductor device can be reduced. Thus, the thickness of the frame plate can be relatively increased. Consequently, the resultant semiconductor device can be prevented from being deformed. In addition, a traveling problem of the semiconductor device caused by a transfer belt or the like can be prevented.

In addition, since the semiconductor pellet is mounted on the recess surface, even if the thickness of the semiconductor pellet is relatively increased, the total thickness of the semiconductor pellet can be reduced. Thus, in the wafer rear-surface abrading process preceded by the semiconductor pellet manufacturing process, the abrading time can be reduced. Thus, the process margin becomes wide and thereby the process can be easily managed. In other words, in the semiconductor pellet manufacturing process, the semiconductor device assembling process, and so forth, the process margin becomes wide and thereby the productivity can be improved.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A manufacturing method of a semiconductor device with a thickness of 1 mm or less, comprising the steps of:
   (a) connecting a peripheral portion of a first surface of a frame plate main body with a thickness in the range from 0.1 mm to 0.25 mm and an external connection lead in such a manner that the external connection lead extends to the outside of the frame plate main body;
   (b) mounting a semiconductor pellet with a thickness in the range from 0.2 mm to 0.3 mm to the first surface of the frame plate main body;
   (c) electrically connecting an electrode of the semiconductor pellet and a connection portion at the end of a corresponding external connection lead with a bonding wire; and
   (d) mounting the resultant module of the step (c) to a transfer mold type die and pressure-fitting a sealing resin so as to transfer-mold and resin-seal at least a region including the semiconductor pellet, the bonding wire, and a connection portion.

2. The manufacturing method as set forth in claim 1, further comprising the step of mounting the semiconductor pellet in such a manner that the difference between the upper surface of the external connection lead and the upper surface of the semiconductor pellet and/or the difference between the lower surface of the external connection lead and the lower surface of the frame plate is 0.2 mm or less.

3. A manufacturing method of a semiconductor device with a thickness of 1 mm or less, comprising the steps of:
   (a) forming a recess portion on a first main surface of a frame plate main body and a wiring pattern including a connection pad to a peripheral portion of the first main surface, the thickness of the frame plate main body being in the range from 0.3 mm to 0.5 mm, the depth of the recess portion being in the range from 0.2 mm to 0.3 mm, the recess portion being adapted for mounting the semiconductor pellet;
   (b) electrically connecting an electrode of the semiconductor pellet and a corresponding connection pad with a bonding wire;
   (c) forming a flat type external connection terminal on a second main surface of the frame plate main body, the wiring pattern on the first main surface being connected to the second main surface via a through-hole; and
   (d) mounting the resultant module of the step (c) to a transfer mold type die and pressure-fitting a sealing resin so as to transfer-mold and resin-seal at least a region including the semiconductor pellet, the bonding wire, and a connection portion.

4. The manufacturing method as set forth in claim 3, wherein the difference between the upper surface of the frame plate and the upper surface of the semiconductor pellet is 0.2 mm or less.

5. The manufacturing method as set forth in claim 3, wherein the plane area of the semiconductor pellet is at least 40 mm$^2$.

* * * * *